(12) United States Patent
Fujii et al.

(10) Patent No.: US 7,436,272 B2
(45) Date of Patent: Oct. 14, 2008

(54) PIEZOELECTRIC DEVICE

(75) Inventors: Hidetoshi Fujii, Ishikawa-ken (JP); Masaki Takeuchi, Otsu (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 0 days.

(21) Appl. No.: 11/641,890

(22) Filed: Dec. 20, 2006

(65) Prior Publication Data

US 2007/0096605 A1   May 3, 2007

Related U.S. Application Data

(63) Continuation of application No. PCT/JP2005/008426, filed on May 9, 2005.

(30) Foreign Application Priority Data

Jun. 25, 2004   (JP) .............................. 2004-188843

(51) Int. Cl.
*H03H 9/00* (2006.01)
(52) U.S. Cl. ...................... 333/187; 333/186; 333/190; 310/348
(58) Field of Classification Search ................. 310/365, 310/348, 324, 366; 333/187, 188, 189, 190, 333/191, 192, 193, 194, 195, 196, 133
See application file for complete search history.

(56) References Cited

U.S. PATENT DOCUMENTS

| 5,825,262 A | * | 10/1998 | Inoue et al. ................. 333/189 |
| 2004/0232802 A1 | * | 11/2004 | Koshido ...................... 310/348 |

FOREIGN PATENT DOCUMENTS

| JP | 04-293310 | 10/1992 |
| JP | 04293310 | * 10/1992 |
| JP | 07-283334 | 10/1995 |
| JP | 08-213764 | 8/1996 |
| JP | 08-213874 | 8/1996 |
| JP | 10-209795 | 8/1998 |
| JP | 2000-040762 | 2/2000 |
| JP | 2000-196400 | 7/2000 |

(Continued)

OTHER PUBLICATIONS

International Search Report from corresponding International application dated Aug. 23, 2005.

(Continued)

*Primary Examiner*—Darren Schuberg
*Assistant Examiner*—Bryan P Gordon
(74) *Attorney, Agent, or Firm*—Dickstein Shapiro LLP

(57) ABSTRACT

A pizoelectric filter capable of improving the shielding property and increasing the heat releasing property is provided. The piezoelectric device includes a cover and piezoelectric device chips which are stacked and sealed together. The piezoelectric device also includes first external electrodes exposed at an upper surface of the cover and a grounded second external electrode exposed at the upper surface and a side surface of the cover. Electroconductive bonding materials are disposed between the cover and the piezoelectric device chips and all around an outer edge which connects the cover to the piezoelectric device chips so as to form a seal. The electroconductive bonding materials are also connected to the grounded second external electrode.

7 Claims, 4 Drawing Sheets

FOREIGN PATENT DOCUMENTS

| | | |
|---|---|---|
| JP | 2000-312127 | 11/2000 |
| JP | 2000-353934 | 12/2000 |
| JP | 2001-094390 | 4/2001 |
| JP | 2002-208830 | 7/2002 |
| JP | 2002-232253 | 8/2002 |
| JP | 2002 261581 | 9/2002 |
| JP | 2003-188294 | 7/2003 |
| JP | 2004-017171 | 1/2004 |
| JP | 2004-503164 | 1/2004 |
| JP | 2004-129223 | 4/2004 |
| WO | WO-2005/031862 A1 | 4/2005 |

OTHER PUBLICATIONS

The Written Opinion from corresponding International application dated Aug. 23, 2005.

* cited by examiner (a)

(b)

(c)

(a)

(b)

(c)

PIEZOELECTRIC DEVICE

CROSS REFERENCE TO RELATED APPLICATIONS

The present application is a continuation of International Application No. PCT/JP2005/008426, filed May 9, 2005, which claims priority to Japanese Patent Application No. JP2004-188843, filed, Jun. 25, 2004, the entire contents of each of these applications being incorporated herein by reference in their entirety

FIELD OF THE INVENTION

The present invention relates to a piezoelectric device provided with elements, e.g., a resonator and a filter, including piezoelectric thin films.

BACKGROUND OF THE INVENTION

In order to miniaturize piezoelectric devices, e.g., piezoelectric thin film filters (BAW filters) and surface acoustic wave filters (SAW filters), a CSP (chip size package), in which an element chip and a cover are sealed by a bonding layer formed along outer edges of their respective main surfaces, has been proposed previously (refer to, for example, Patent Documents 1 and 2).

Patent Document 1: Japanese Unexamined Patent Application Publication No. 2004-17171

Patent Document 2: Japanese Unexamined Patent Application Publication No. 2001-94390

In the configuration disclosed in Patent Document 1, a wiring connecting between an excitation electrode and an input and output external electrode disposed on the circumference surface is formed on a piezoelectric filter chip main surface. Since this wiring intersects with a bonding layer which bonds the filter chip to the cover, the bonding layer must have an insulating property.

In the configuration disclosed in Patent Document 2, a sealing component is formed from an electroconductive bonding material along outer edges of a base substrate and a surface acoustic element so as to bond and seal. This sealing component is not grounded.

Each of these configurations has poor shielding properties.

The heat generated from the filter is transferred through the wiring and is released from an external electrode to a mounting substrate. The degree of heat release varies depending on the arrangement of the external electrode of the piezoelectric filter.

In the configuration in Patent Document 1, the wiring from the excitation electrode (heat generation portion) reaches the end of the piezoelectric filter through a portion in which the piezoelectric element and the cover are bonded together, and is connected to the mounting substrate through the external electrode formed on the side surface of the cover. Therefore, the route becomes relatively long, and the heat releasing property is poor.

In the configuration in Patent Document 2, one end of a through hole penetrating the cover is connected to a pad, which is connected to the excitation electrode, and the other end is connected to the external electrode. Therefore, the distance between the heat generation portion and the mounting substrate is short. However, since the arrangement of the external electrode is not taken into consideration, the heat releasing property to the mounting substrate is not always good.

SUMMARY OF THE INVENTION

In consideration of the above-described problems, it is an object of the present invention to provide a piezoelectric device capable of improving the shielding property and increasing the heat releasing property. Hereafter, the piezoelectric device refers to a piezoelectric resonator or a piezoelectric filter including the piezoelectric resonator.

This piezoelectric device is a type in which a cover and a piezoelectric device chip are stacked and sealed. The piezoelectric device is provided with first external electrodes exposed at a second main surface opposite to a first main surface of the cover opposing the piezoelectric device chip, a grounded second external electrode exposed at the second main surface of the cover, and an electroconductive bonding material, which is disposed between the cover and the piezoelectric device chip and all around an outer edge which connects the cover to the piezoelectric device chip so as to seal, and which is connected to the grounded second external electrode.

In this configuration, the electroconductive bonding material surrounds a piezoelectric device element disposed in the piezoelectric device chip. When the second external electrode serves as a ground terminal, the electroconductive bonding material is connected to the earth and, thereby, the piezoelectric device elements can be electrostatically shielded.

Furthermore, the heat generated from the piezoelectric device chip can be released not only from the first external electrodes, but also from the second substrate through the electroconductive bonding material.

In this configuration, the second external electrode can be disposed at an arbitrary place on the outer edge of the cover. Therefore, placing importance on the electrical characteristics and the electric power resistance, the first external electrodes can be appropriately assigned to the external electrodes to be used for the input and output of the piezoelectric device elements, and the second external electrode can be disposed as an external electrode for grounding. Since the characteristics of the piezoelectric device are not sacrificed for the external electrode, the characteristics of the piezoelectric device can be optimized.

Preferably, the first external electrode is disposed in each of four or more rectangular regions resulting from division of the second main surface of the cover into equal parts in a lattice pattern. Most preferably, a first external electrodes are disposed in the center of each rectangular region.

The second main surface of the cover is preferably divided equally into 2×2 or more rectangular regions.

According to this configuration, the first external electrode is disposed at the center or in the vicinity of the center of each rectangular region resulting from division into equal parts in a lattice pattern. Therefore, the pressure during the mounting becomes uniform, and the piezoelectric device can be mounted parallel to the substrate. Consequently, the reliability of electrical connection between the piezoelectric device and the substrate can be improved.

The distances between the first external electrodes are substantially uniform, and a heat transfer route from each part in the piezoelectric device to the substrate can be minimized. The heat generated in the piezoelectric device tends to be released to the substrate through the first external electrodes. Therefore, the heat releasing property of the piezoelectric device can be improved.

Preferably, the second external electrode is disposed in such a way as to include a vertex of the rectangular region.

According to this configuration, the second external electrode is arranged at a position suitable for minimizing the deviation from the first external electrodes and, thereby, the pressure and the heat release are allowed to become uniform during the mounting.

Preferably, a through hole, in which an electroconductive material is disposed on the inside perimeter surface thereof, penetrating between the first main surface and the second main surface of the cover, is provided. The electroconductive material is connected to the first external electrode at one end of the through hole. At the other end of the through hole, the electroconductive material is bonded to an electrode terminal of an element disposed in the piezoelectric device chip with the electroconductive bonding material.

In this configuration, the heat generated in the piezoelectric device chip is released to the substrate through the electrode terminal, the through hole, and the first external electrode. Accordingly, the heat releasing property can be improved.

Preferably, the through hole is prepared by filling the hole with a filler.

In this configuration, poor connection due to melting and outflow of the electroconductive material in the through hole caused by contact with solder during the mounting of the piezoelectric device can be prevented by the filler.

Preferably, the other end of the through hole is connected to the electrode terminal disposed in the portion exhibiting a maximum temperature increase of the piezoelectric device chip or a portion in the vicinity thereof.

According to this configuration, the heat generated from the piezoelectric device chip is easily released to the substrate through the external electrodes.

The piezoelectric device chip can be used as a piezoelectric thin film device provided with a support substrate and a thin film portion, which is supported by the support substrate, which is acoustically separated from the support substrate, and in which a piezoelectric thin film is disposed between a pair of opposing excitation electrodes.

The piezoelectric device chip can also be used as a surface acoustic wave device provided with a piezoelectric substrate and an IDT composed of a pair of interdigital excitation electrodes disposed on the piezoelectric substrate.

The piezoelectric device of the present invention can improve the shielding property and, in addition, improve the heat releasing property.

Figure 1:
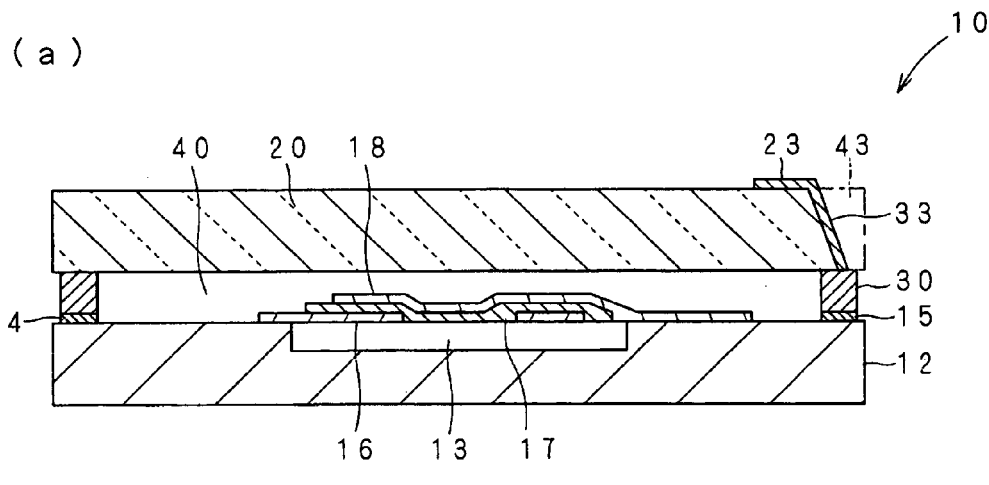
FIG. 1 is a diagram of a piezoelectric device according to an embodiment of the invention.
Figure 1:
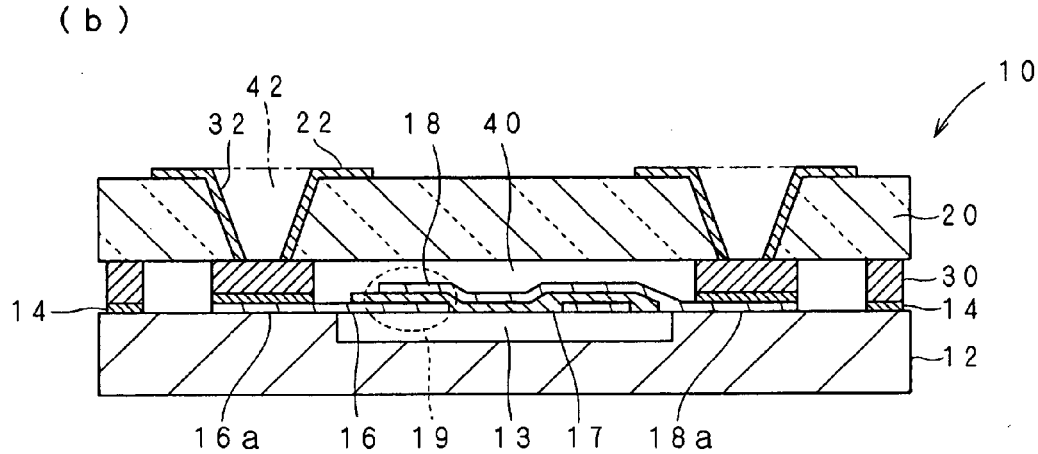
Figure 1:
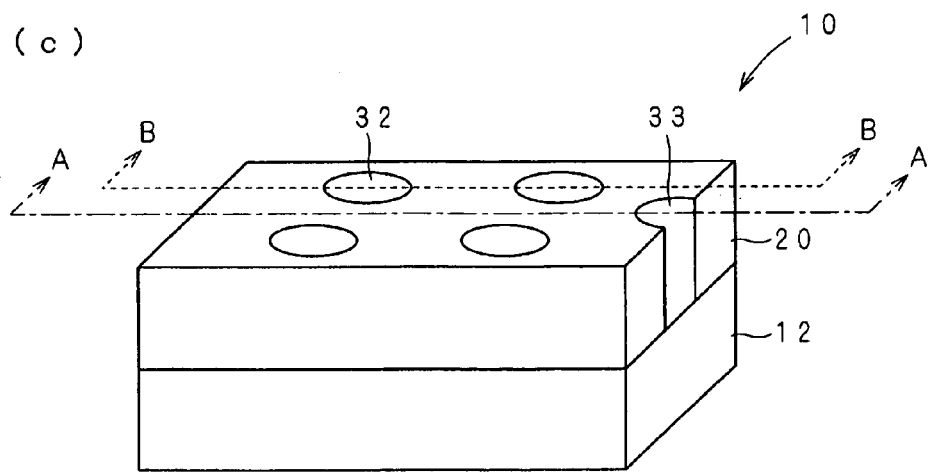

REFERENCE NUMERALS 10, 10a: piezoelectric device
12: silicon substrate (piezoelectric device chip, support substrate)
14: metal film (electroconductive bonding material)
16: electrode film (piezoelectric device chip, excitation electrode)
16a: pad (electrode terminal)
17: piezoelectric thin film (piezoelectric device chip)
18: electrode film (piezoelectric device chip, excitation electrode)
18a: pad (electrode terminal)
19: vibration portion (piezoelectric device element, thin film portion)
20: glass substrate (cover)
21a to 21d: rectangular region
22: external electrode (first external electrode)
23: external electrode (second external electrode)
30: metal film (electroconductive bonding material)
32, 33: through hole
42, 43: filler

DETAILED DESCRIPTION OF THE INVENTION

The embodiment of the present invention will be described below with reference to examples and FIG. 1 to FIG. 4.

As indicated by an external view shown in FIG. 1 (c), a piezoelectric device 10 has a silicon substrate 12 provided with an element and a glass substrate 20 serving as a cover. The silicon substrate 12 and the glass substrate 20 are stacked and sealed.

As shown in FIGS. 1 (a) and (b), which are sectional views taken along lines A-A and B-B shown in FIG. 1 (c), a hole 13 is disposed by removal with etching or the like in a surface of the silicon substrate 12 opposing to the glass substrate 20. A vibration portion 19, in which a piezoelectric thin film 17 is sandwiched between electrode films 16 and 18, is disposed on the hole 13. The vibration portion 19 floats in an internal space 40, and is acoustically separated. For example, Al electrode films 16 and 18 and an AlN piezoelectric thin film 17 are formed by evaporation or sputtering. The vibration portion 19 may be configured so as to float over the silicon substrate 12 without forming a hole 13.

The electrode films 16 and 18 and the piezoelectric thin film 17 are formed into an appropriate shape and, thereby, a plurality of vibration portions 19, that is, resonators, are connected in a ladder type, so that an arbitrary ladder filter, e.g., π type seven-element and T type five-element, can be formed. In order to connect to the outside, the electrode films 16 and 18 are provided with a pad 16a and a pad 18a, which serve as electrode terminals, at positions opposing to a through hole 32 of the glass substrate 20 described below.

The glass substrate 20 is provided with through holes 32 and 33 penetrating the glass substrate 20 and in which an electroconductive material is disposed on the inside perimeter surface thereof. The through holes 32 and 33 can be formed by a laser or by sandblast or etching after a pattern is formed with a photosensitive resin. The upper ends of the electroconductive material in the through holes 32 and 33 are joined to the external electrodes 22 and 23. It is possible to simultaneously form the through holes 32 and 33 and the external electrodes 22 and 23 by disposing the electroconductive material on the inside perimeter surfaces of the through holes and on the periphery portions of the openings thereof by evaporation, sputtering, plating, or the like.

Four through holes 32 and external electrodes 22 (hereafter may be referred to as "first external electrodes 22") in complete shapes are disposed in the center portion of the glass substrate 20. The first external electrodes 22 are exposed at the upper surface of the glass substrate 20. In the periphery portion of the glass substrate 20, the through hole 33 and the external electrode 23 (hereafter may be referred to as "a second external electrode 23") are disposed in the shape of being divided into substantially halves. The second external electrode 23 includes not only the portion disposed on the upper surface of the glass substrate 20, but also the electroconductive material portion of the through hole 33 exposed at the side surface of the glass substrate 20.

The through holes 32 and 33 may be filled with fillers 42 and 43, as indicated by chain lines. A metal or a resin is used as the fillers 42 and 43. The fillers 42 and 43 can be filled by a method in which, for example, metal masks are stacked and Cu is evaporated, a resist mask is formed and Cu is plated, or an electroconductive resin, DOTITE (trade name), or an insulating resin is screen-printed. The fillers 42 and 43 prevent an occurrence of poor connection due to, for example, melting and outflow of the electroconductive material in the through hole 32 and 33 caused by contact with solder during the mounting of the piezoelectric device 10 on the substrate. The reliability of sealing of the piezoelectric device 10 can be improved by filling the filler 42 into the through hole 32 hermetically. The area of the second external electrode 23 can be increased by filling the electroconductive filler 43 into the through hole 33.

The silicon substrate 12 is joined to the glass substrate 20 with metal films 14 and 30 so as to be sealed.

That is, the metal film 14 is disposed all around the outer edge on the upper surface of the silicon substrate 12 opposing to the glass substrate 20. The metal film 30 is disposed all around the outer edge on the lower surface of the glass substrate 20 opposing to the silicon substrate 12.

The metal films 14 and 30 contain at least one type of component of Cu and Sn. Resist masks having predetermined openings are formed on the surfaces of the silicon substrate 12 and the glass substrate 20 to be provided with the metal films 14 and 30 and, thereafter, the above-described metal is evaporated in a range of 0.1 μm to 50 μm, in which the films are formed easily, and lifted off. The silicon substrate 12 and the glass substrate 20 are stacked, the metal films 14 and 30 are brought into contact with each other, followed by heating, so as to be converted to a solder alloy. Consequently, the silicon substrate 12 and the glass substrate 20 are joined to each other so as to be sealed. For example, Au—Sn solder, Ni—Sn solder, or Ag—Sn solder may be used in place of Cu—Sn solder.

The metal film 14 is also disposed on the pads 16a and 18a, and the metal film 30 is also disposed at the lower end of the through holes 32 and 33. Consequently, the pads 16a and 18a are joined and electrically connected to the through holes 32 and 33 simultaneously with the sealing.

Figure 2:
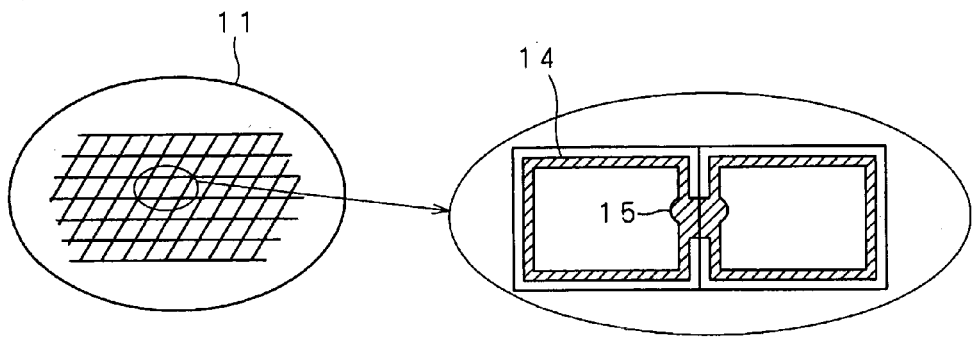
FIG. 2 is a diagram explaining a method for manufacturing the piezoelectric device of FIG. 1.
Figure 2:
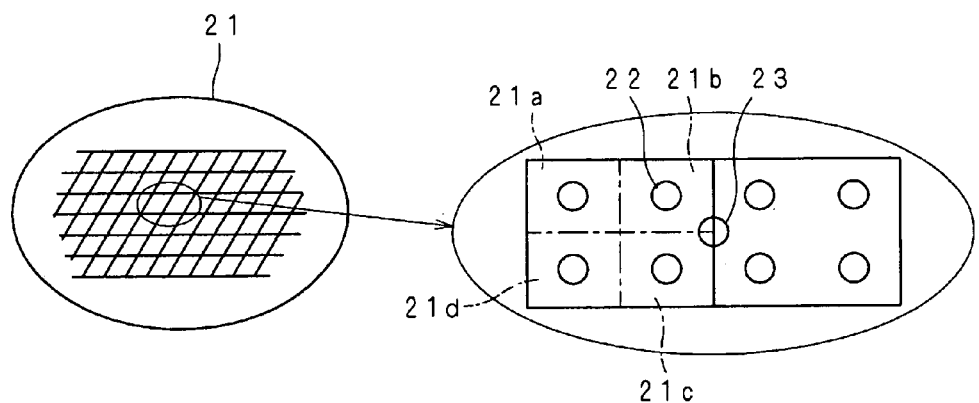
Figure 2:
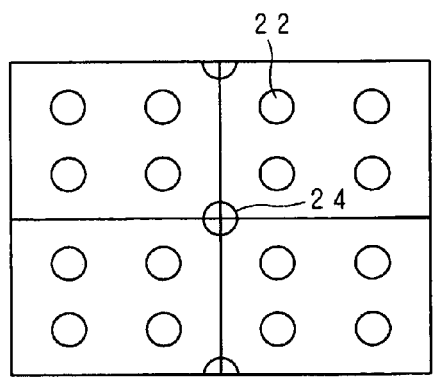

As schematically shown in FIG. 2, a plurality of piezoelectric devices 10 can be produced simultaneously.

As shown in FIG. 2 (a), a plurality of silicon substrate 12 side configurations are integrally formed on a wafer 11. At this time, the metal film 14 disposed on a piezoelectric device chip basis is specified to have a substantially constant width. However, an enlarged portion 15 is disposed as a part thereof. The enlarged portion 15 is in the shape corresponding to the lower end of the through hole 33 to be divided, and is joined to an enlarged portion of the adjacent piezoelectric device chip so as to be integrated.

As shown in FIG. 2 (b), a plurality of glass substrate 20 side configurations are integrally formed on an integrated substrate 21. The through hole 33 and the second external electrode 23 to be divided are disposed on a boundary line between adjacent glass substrates 20. The four first external electrodes 22 disposed in the center portion of the glass substrate 20 are arranged at the individual centers of the rectangular regions 21a to 21d resulting from division of the upper surface of the glass substrate 20 into four equal parts in a lattice pattern or in the vicinity of the center. The external electrodes 22 are arranged in such a way as to include the barycenters of the rectangular regions 21a to 21d, respectively. The barycenters of the external electrodes 22 may be arranged in the state of being deviated slightly from the barycenters of the rectangular regions 21a to 21d.

Since the first external electrodes 22 are substantially uniformly arranged, the pressure during the mounting becomes uniform, and the piezoelectric device can be mounted parallel to the substrate. Consequently, the reliability of electrical connection between the piezoelectric device 10 and the substrate can be improved. The distances between the first external electrodes 22 are substantially equal, and a heat transfer route from each part in the piezoelectric device 10 to the substrate can be minimized. The heat generated in the piezoelectric device 10 tends to be released to the substrate through the first external electrodes 22. Therefore, the heat releasing property of the piezoelectric device 10 can be improved.

The second external electrode 23 is disposed in such a way as to include vertexes of the rectangular regions 21b and 21c. The second external electrode 23 is arranged at a position suitable for minimizing the deviation from the first external electrodes 22 and, thereby, the pressure and the heat release during the mounting can be made uniform.

The wafer 11 and the integrated substrate 21 are stacked, and bonded by heating, so that a plurality of piezoelectric devices 10 are integrally formed. Thereafter, individual piezoelectric devices 10 are separated by dicing or the like along the boundary lines.

The through hole 33 and the second external electrode 23 disposed on the boundary line, that is, a cutting-plane line, are divided into halves, and one cut surface of each of the through hole 33 and the second external electrode 23 is exposed at the outside.

As shown in FIG. 2 (c), an external electrode 24 may be disposed at a corner portion at which four glass substrates 12 are adjacent to each other, and this external electrode 24 may be divided into four parts. In this case, two cut surfaces of the external electrode 24 are exposed at the outside.

A specific example of the piezoelectric device 10 will be described below. The size of each of the silicon substrate 12 and the glass substrate 20 is 1.8 mm×1.5 mm. The width of the metal film 14 (except the enlarged portion 15) formed along the outer edge is 50 μm. The diameters of the through holes 32 and 33 are 200 μm.

Figure 3:
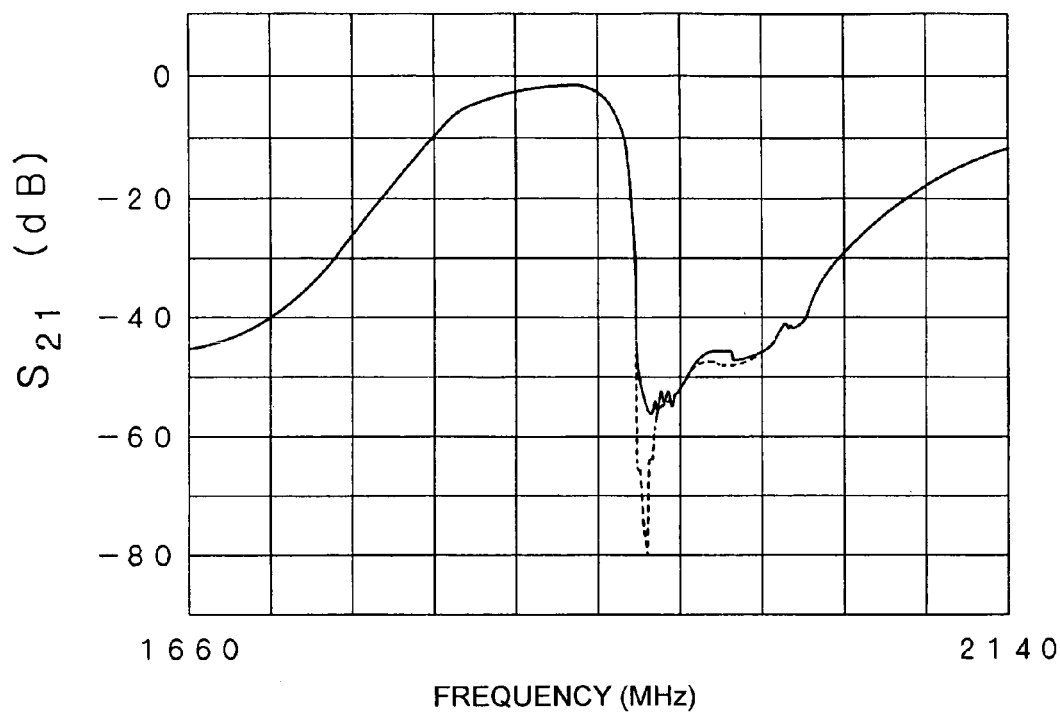
FIG. 3 is a graph showing a filter characteristic of the piezoelectric device.

FIG. 3 shows an example ($S_{21}$ of transmitting-side filter) of filter characteristics of the piezoelectric device 10 having the above-described configuration. A solid line indicates the characteristic when the second external electrode 23 is not connected to the earth. A dotted line indicates the characteristic when the second external electrode 23 is connected to the earth. It is clear that the attenuation characteristic of the piezoelectric device 10 is improved by grounding the metal films 14 and 30 disposed all around the outer edge through the second external electrode 23.

When the piezoelectric device 10 having the above-described configuration is grounded by using the second external electrode 23, which is disposed on the outer edge and is divided, as a ground terminal, the metal films 14 and 30 disposed all around the outer edge are grounded and do not become a floating electrode electrically independent of the other portions, so that the attenuation characteristic of the filter is improved.

The metal films 14 and 30 disposed all around the outer edge function as shields when being grounded, and prevent emission and capture of unnecessary radio waves. Consequently, malfunction of the piezoelectric device 10 and malfunction of apparatuses can be prevented.

Since the second external electrode 23 is formed together with the adjacent piezoelectric device chip, the area of the external electrode for connection to the ground can be reduced and, thereby, the chip area can be reduced.

Furthermore, the electroconductive portion of the second external electrode 23 is exposed at two surfaces, the upper surface and the side surface, of the glass substrate 20 and, therefore, a mounting area is increased and mounting strength is improved. An increase in resistance during the mounting is suppressed and, by extension, a loss of the piezoelectric device is reduced.

On the other hand, the first external electrodes 22 disposed inside the piezoelectric device 10 while being in the complete state are uniformly arranged without deviation. Therefore, the mounting pressure on a first external electrode 22 basis becomes uniform, and the piezoelectric device 10 can be mounted parallel to the substrate. Consequently, the reliability of electrical connection between the piezoelectric device 10 and the substrate can be improved.

How to assign the functions of terminals to the external electrodes is limited by the pattern layout of the piezoelectric device elements in the piezoelectric device 10. Since it is not necessary to assign the ground terminal for shielding to the first external electrodes 22 disposed without deviation, the degree of flexibility in the assignment of terminals is increased. Therefore, it becomes possible to determine the pattern layout of the piezoelectric device elements to the advantage of the characteristics of the piezoelectric device 10.

The present invention is not limited to the above-described example, and can be carried out while various modifications are made.

Figure 4:
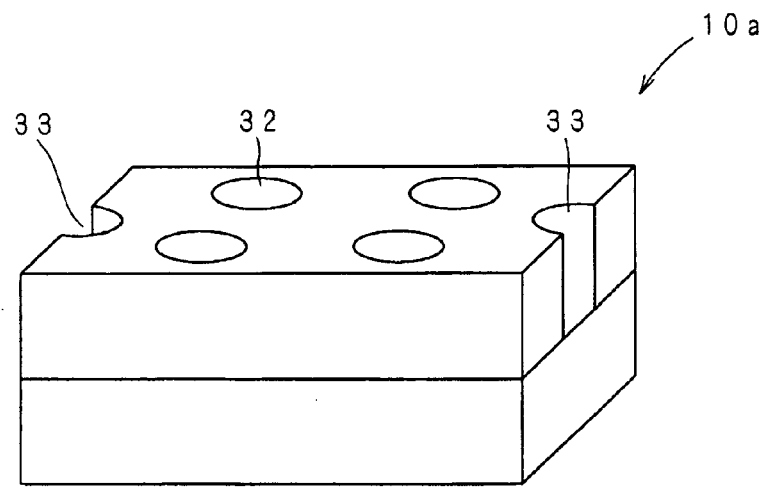
FIG. 4 is a diagram of a piezoelectric device according to a second embodiment of the invention.

For example, as shown in FIG. 4, at least two through holes 33 and second external electrodes, which are disposed on the outer edge and are divided, may be used. In this case, when the arrangement is substantially point symmetric (substantially vertically and bilaterally symmetric), the piezoelectric devices 10a can be mounted more uniformly.

For example, the first external electrode may be any one of a circle, an ellipse, a rectangle, and a combination thereof. The sizes of the first external electrodes may be the same, or the sizes may be changed appropriately. The number of the first external electrodes may be set appropriately in response to the number of the resonators included in the piezoelectric device or the function of the piezoelectric device.

The grounded second external electrode may also be any one of a circle, an ellipse, a rectangle, and a combination thereof. The sizes of all second external electrodes may be the same, or the size may be changed appropriately. A plurality of second external electrodes may be disposed.

A plurality of grounded second external electrodes may be disposed on one side of the cover. The shape of the second external electrode disposed on a side or a corner of the cover is not limited to the shape of a divided circle, and may be the shape of a divided rectangle. In this case, since the grounded second external electrode can be disposed at a position at which the first external electrode is not disposed, the piezoelectric devices can be mounted uniformly.

Figure 5:
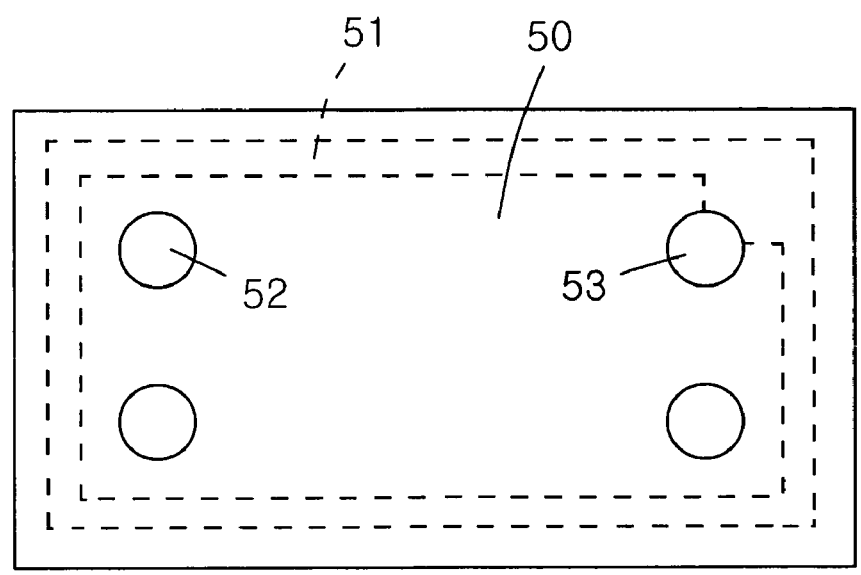
FIG. 5 is a diagram of a piezoelectric device according to a third embodiment of the invention.

For example, as shown in FIG. 5, the grounded second external electrode 53 may be exposed at a second main surface 50 of the cover, similar to the first external electrode 52. One grounded second external electrode 53 may be disposed as shown in the drawing, or a plurality of electrodes may be disposed along a sealing frame 51. Alternatively, the electrode may be disposed at the center of the second main surface of the cover. The shapes of the first external electrode and the second external electrode are not limited to the shape of a circle, and may be an appropriate shape, e.g., an ellipse and a rectangle. The shape and size of the second external electrode may be different from those of the first external electrode. In this case, since the external electrodes can be disposed at substantially vertically and bilaterally symmetric positions, the piezoelectric devices can be mounted uniformly.

In the example, the ladder filter is formed. However, a lattice filter can be formed by connecting resonators in a lattice pattern. In this case, a balance-balance filter can be produced.

The resonator is formed as a multimode resonator and, thereby, a multimode filter can be formed. In this case, a high selectivity filter can be produced.

For example, a silicon substrate may be used as the material for the cover in place of the glass substrate. In this case, since the coefficient of linear expansion of the silicon substrate provided with the element can be made equal to that of the cover, the residual stress due to heat shrinkage after solder sealing can be reduced, and the influence exerted on the element characteristics can be reduced. Since the semiconductive silicon substrate serving as the cover is grounded through the electroconductive bonding material, unnecessary radio wave can be shielded.

The present invention can be applied to not only the piezoelectric thin film filter (BAW), but also the surface acoustic filter (SAW) and the like. For the piezoelectric thin film filter, the above-described piezoelectric device chip is provided with a support substrate and a thin film portion, which is supported by the above-described support substrate, which is acoustically separated from the above-described support substrate, and in which a piezoelectric thin film is disposed between a pair of opposing excitation electrodes. For the surface acoustic filter, the above-described piezoelectric device is provided with a piezoelectric substrate and an IDT composed of a pair of interdigital excitation electrodes disposed on the above-described piezoelectric substrate.

The invention claimed is:

1. A piezoelectric device, comprising:
   a cover having a first surface and a second surface opposite the first surface;
   a piezoelectric device chip sealed to the first surface of the cover;
   first external electrodes exposed at the second surface of the cover;
   a grounded second external electrode exposed at the second surface of the cover; and
   an electroconductive bonding material disposed between the first surface of the cover and the piezoelectric device chip and around an outer edge thereof, the electroconductive bonding material sealing the cover to the piezoelectric device chip and connected to the grounded second external electrode,
   wherein each of the first external electrodes are disposed in a center portion of one of four respective rectangular regions resulting from division of the second surface of the cover into equal parts in a lattice pattern such that the first external electrodes are substantially uniformly arranged at the second surface of the cover, and
   the second external electrode is disposed along a vertex of at least two of the four respective rectangular regions.

2. The piezoelectric device according to claim 1, wherein the grounded second external electrode is exposed at a circumferential surface between the first surface and the second surface of the cover.

3. The piezoelectric device according to claim 1, further comprising:
   a through hole extending between the first surface and the second surface of the cover; and
   electroconductive material disposed on an inside perimeter surface of the through hole, wherein the electroconductive material is connected to the first external electrode at a first end of the through hole, and at a second end of the through hole, the electroconductive material is connected to an electrode terminal of an element disposed in the piezoelectric device chip via the electroconductive bonding material.

4. The piezoelectric device according to claim 3, wherein the through hole includes a filler.

5. The piezoelectric device according to claim 3, wherein the electrode terminal is disposed in a portion of the device exhibiting a maximum temperature increase or a portion of the device in the vicinity thereof.

6. The piezoelectric device according to claim 1, wherein the piezoelectric device chip is a piezoelectric thin film device comprising a support substrate and a thin film portion supported by the support substrate and acoustically separated from the support substrate, and in which a piezoelectric thin film is disposed between a pair of opposing excitation electrodes.

7. The piezoelectric device according to claim 1, wherein the piezoelectric device chip is a surface acoustic wave device comprising a piezoelectric substrate and a pair of interdigital excitation electrodes disposed on the piezoelectric substrate.

* * * * *